(12) United States Patent
Choi

(10) Patent No.: US 10,288,999 B2
(45) Date of Patent: May 14, 2019

(54) METHODS FOR CONTROLLING EXTRUSIONS DURING IMPRINT TEMPLATE REPLICATION PROCESSES

(71) Applicant: CANON KABUSHIKI KAISHA, Tokyo (JP)

(72) Inventor: Byung-Jin Choi, Austin, TX (US)

(73) Assignee: CANON KABUSHIKI KAISHA (JP)

( * ) Notice: Subject to any disclaimer, the term of this patent is extended or adjusted under 35 U.S.C. 154(b) by 162 days.

(21) Appl. No.: 15/385,353

(22) Filed: Dec. 20, 2016

(65) Prior Publication Data
US 2018/0169910 A1    Jun. 21, 2018

(51) Int. Cl.
*G03F 7/00* (2006.01)

(52) U.S. Cl.
CPC ................ *G03F 7/0002* (2013.01)

(58) Field of Classification Search
CPC ................................................ B29C 43/36
See application file for complete search history.

(56) References Cited

U.S. PATENT DOCUMENTS

| 7,157,036 B2 | 1/2007 | Choi et al. |
| 7,473,090 B2 * | 1/2009 | McMackin ............ B82Y 10/00 425/385 |
| 8,076,386 B2 | 12/2011 | Xu et al. |
| 2007/0228589 A1 * | 10/2007 | Choi ...................... B82Y 10/00 264/39 |
| 2010/0320645 A1 * | 12/2010 | Ganapathisubramanian ............... B82Y 10/00 264/293 |
| 2018/0059537 A1 * | 3/2018 | Jung ..................... G03F 7/0002 |
| 2018/0117805 A1 | 5/2018 | Choi |
| 2018/0136556 A1 | 5/2018 | Choi et al. |
| 2018/0149968 A1 | 5/2018 | Choi et al. |

FOREIGN PATENT DOCUMENTS

JP    5942551 B2    6/2016

OTHER PUBLICATIONS

Machine translation of abstract for JP5942551, retrieved from ESPACENET (online) at https://worldwide.espacenet.com/publicationDetails/biblio?II=0&ND=3&adjacent=true&locale=en_EP&FT=D&date=20131017&CC=JP&NR=2013214627A&KC=A#; retrieved on May 24, 2017.

* cited by examiner

*Primary Examiner* — Robert C Boyle
(74) *Attorney, Agent, or Firm* — Daniel Ratoff

(57) ABSTRACT

A method that can be used in the formation of replica imprint templates. The method can include providing a substrate with a substrate mesa defining an active region having a first area and a template with a template mesa defining a patterning region having a second area, where first area is larger than the second area. The template can then be positioned relative to the substrate such that patterning region of the template mesa overlaps the active region of the substrate mesa. The method can be used in forming a replica template. The formed replica template can be used to form a patterned layer on e.g. a semiconductor wafer in fabricating an electronic device. A system can be configured to carry out the methods.

13 Claims, 5 Drawing Sheets

METHODS FOR CONTROLLING EXTRUSIONS DURING IMPRINT TEMPLATE REPLICATION PROCESSES

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating layers of integrated devices such as CMOS logic, microprocessors, NAND Flash memory, NOR Flash memory, DRAM memory, or other memory devices such as MRAM, 3D cross-point memory, Re-RAM, Fe-RAM, STT-RAM, and the like. A typical nanoimprint lithography process applies a pattern to a substrate by filling the relief images provided on an imprint template (or mask) with a formable resist material and then converting the material into a solid, for example, by applying UV light to a UV-curable form of resist material. After solidification, the template is separated from the solidified patterned resist material. In such processes it remains it is desirable to avoid extrusion of the formable material beyond the template patterning surface. When such extrusion occurs, it can lead to a variety of imprint and post-imprint

SUMMARY

In an aspect, methods provided herein include (i) providing a substrate having a mesa extending from a surface of the substrate, the substrate mesa defining an active region having a first area; (ii) providing a template having a mesa extending from a surface of the template, the template mesa defining a patterning region having a second area with the second area larger than the first surface area of the substrate and with the template mesa further having a patterning surface with a relief image formed thereon; (iii) positioning the template in superimposition with the substrate such that patterning region of the template mesa overlaps the active region of the substrate mesa; (iv) filling a volume defined between the patterning region of the template and the active region of the substrate with a polymerizable material; (v) solidifying the polymerizable material to form a patterned layer on the substrate; and (vi) separating the template from the solidified patterned layer.

In an embodiment, the first and second areas define first and second perimeters, respectively, and are further configured such that, during the positioning, filling and solidifying steps, a minimum distance between any point on the first perimeter and a nearest point on the second perimeter is such that any polymerizable material that is extruded from between template patterning region and the substrate active region adheres to a sidewall of the substrate mesa and does not adhere to a sidewall of the template mesa. In particular embodiments, the minimum distance is from 1 micron to 50 mm or is from 2 microns to 1 mm. In other embodiments, the template and the substrate have cored-out backside areas or have the same thickness dimensions or are formed of the same material.

In another embodiment the formed pattern is transferred into the substrate to form a replica template. In a further embodiment, the formed replica template is a second generation replica template having the same relief pattern as a master template. In yet a further embodiment, the relief pattern is an array of holes.

In another aspect, a method of using such a formed replica template is provided that includes filling a volume defined between the replica template formed as provided herein and a substrate with a polymerizable material and solidifying the polymerizable material to form a patterned layer on the substrate.

In yet another aspect, a method of manufacturing an article is provided that includes forming a pattern on a substrate as above; transferring the formed pattern into the substrate; and processing the substrate to manufacture the article. In an embodiment, the article is a semiconductor device.

In a further aspect, a system is provided that includes (i) a substrate having a mesa extending from a surface of the mesa, the substrate mesa defining an active region having a first area; and (ii) a template having a mesa extending from a surface of the template, the template mesa defining a patterning region having a second area, with the second area larger than the first surface area of the substrate, and the template mesa further having a patterning surface with a relief image formed thereon.

In an embodiment, the first and second areas define first and second perimeters, respectively, and are further configured such that, when the first areas and second areas are overlapped, there is a minimum distance between any point on the first perimeter and a nearest point on the second perimeter. In particular embodiments, the minimum distance is from 1 micron to 50 mm or is from 2 microns to 1 mm. In other embodiments, the template and the substrate have cored-out backside areas, or have the same thickness dimensions, or are formed of the same material.

Other features and advantages of the present invention will be apparent from the accompanying drawings and from the detailed description that follows.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

As noted above, imprint lithography requires require the direct contact of a template (or mask) with formable material positioned between the template (or mask) and a substrate, e.g., a semiconductor wafer for device manufacture. Because of such contact, it is generally recognized by practitioners that the template lifetime will be limited. As a result, strategies have been adopted to account for such limited template lifetime. Typically a master template is first fabricated using e.g. electron beam (e-beam) techniques to form a desired pattern in a template substrate, such as glass or fused silica. The master template, however, is not typically used to directly form patterns on the device wafer. Instead, template replication processes are typically employed to create multiple replica templates, which are then used to form patterns on e.g. device substrates such as semiconductor wafers.

Such template replication process can further incorporate nanoimprint lithography processes themselves. In such processes, the master template is used to transfer a pattern into a resist material deposited on the surface of a replica template substrate (or "blank"). The resist material is solidified to form a solid layer that has an inverse pattern to that of master template. The substrate and the solidified layer are then subjected to additional processes, such as etching processes, in order to transfer a relief image into the substrate that corresponds to the pattern in the solidified layer, thereby forming a replica template having an inverse pattern of that of the master template. Such replica templates can then be used for nanoimprint lithography production purposes.

Figure 1:
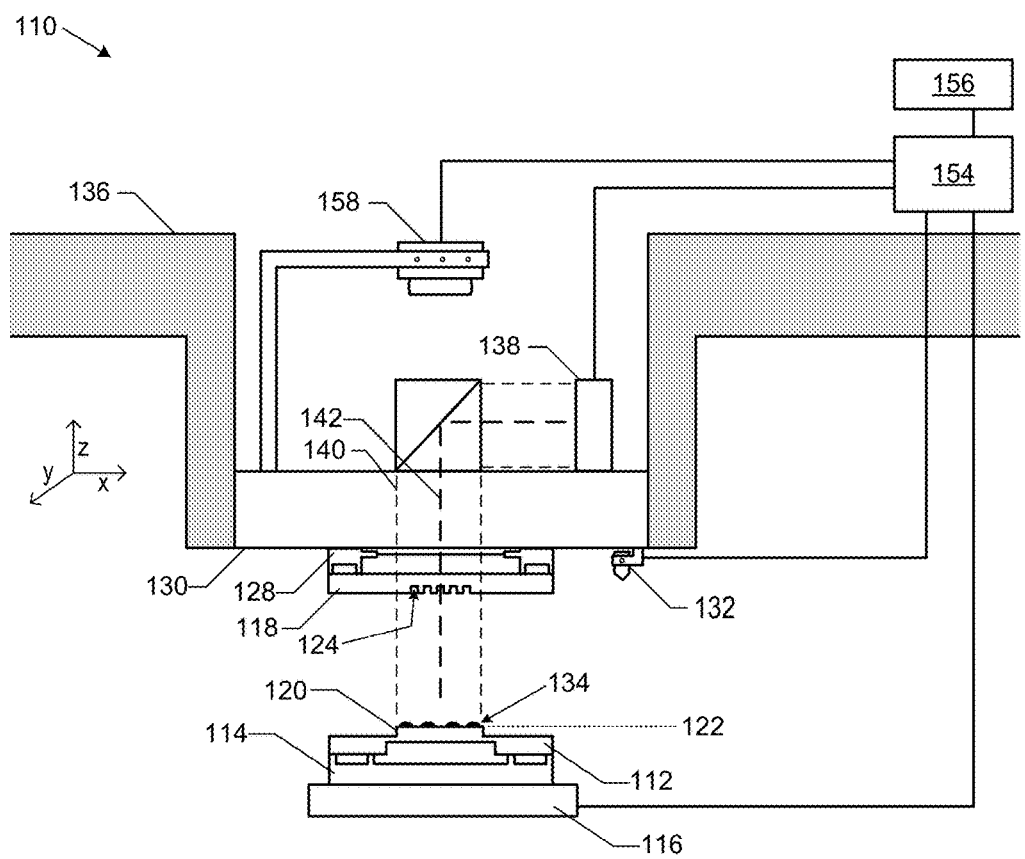
FIG. 1 illustrates a simplified side view of a nanoimprint lithography system having a master template spaced apart from a replica substrate.

Referring to FIG. 1, illustrated therein is an exemplary nanoimprint lithography system 110 used to form a replica template by first forming a relief pattern on replica substrate 112. Substrate 112 may be coupled to substrate chuck 114. As illustrated, substrate chuck 114 is a vacuum chuck. Substrate chuck 114, however, may be any chuck including, but not limited to, vacuum, pin-type, groove-type, electrostatic, electromagnetic, and/or the like.

Substrate 112 and substrate chuck 114 may be further supported by stage 116. Stage 116 may provide translational and/or rotational motion along the x, y, and z-axes. Stage 116, substrate 112, and substrate chuck 114 may also be positioned on a base (not shown). Substrate 112 further includes mesa 120 with surface 122 located thereon. Spaced-apart from substrate 112 is master template 118 with patterning surface 124 located thereon. Patterning surface 124 can comprise pattern features defined by e.g. a plurality of spaced-apart recesses and/or protrusions, and may define any original pattern that forms the basis of a pattern to be formed on surface 122 of substrate 112

Template 118 may be coupled to chuck 128. Chuck 128 may be configured as, but not limited to, vacuum, pin-type, groove-type, electrostatic, electromagnetic, and/or other similar chuck types. Further, chuck 128 may be coupled to imprint head 130 which in turn may be moveably coupled to bridge 136 such that chuck 128, imprint head 130 and template 118 are moveable in at least the z-axis direction.

Template 118 and/or substrate 112 may be formed from such materials including, but not limited to, fused-silica, quartz, silicon, organic polymers, siloxane polymers, borosilicate glass, fluorocarbon polymers, metal, hardened sapphire, and/or the like.

System 110 may further comprise a fluid dispense system 132. Fluid dispense system 132 may be used to deposit formable material 134 (e.g., polymerizable material, also referred to herein as resist) on substrate 112. Formable material 134 may be positioned upon substrate 112 using techniques, such as, drop dispense, spin-coating, dip coating, chemical vapor deposition (CVD), physical vapor deposition (PVD), thin film deposition, thick film deposition, and/or the like. Formable material 134 may be disposed upon substrate 112 before and/or after a desired volume is defined between template 118 and substrate 112 depending on design considerations. For example, formable material 134 may comprise a monomer mixture as described in U.S. Pat. Nos. 7,157,036 and 8,076,386.

Referring to FIG. 1, system 110 may further comprise energy source 138 that directs energy 140 along path 142. Imprint head 130 and stage 116 may be configured to position template 118 and substrate 112 in superimposition with path 142. Camera 158 may likewise be positioned in superimposition with path 142. Nanoimprint lithography system 110 may be regulated by processor 154 in communication with stage 116, imprint head 130, fluid dispense system 132, source 138, and/or camera 158 and may operate on a computer readable program stored in memory 156.

Either imprint head 130, stage 116, or both vary a distance between template 120 and substrate 112 to define a desired volume therebetween that is filled by formable material 134. For example, imprint head 130 may apply a force to template 118 such that template 120 contacts formable material 134. After the desired volume is filled with formable material 134, source 138 produces energy 140, e.g., ultraviolet radiation, causing formable material 134 to solidify and/or cross-link conforming to a shape of surface 122 of substrate 112 and patterning surface 124 of template 118, defining a patterned layer on substrate 112. The substrate and the solidified patterned layer are then subjected to additional processes, such as etching processes, to transfer a relief image into the substrate that corresponds to the pattern in the solidified layer, thereby yielding a replica template.

In many cases, the formation of a first generation replica template as described above is adequate for desired process applications. For example, if a semiconductor wafer to be patterned requires an array of contact holes to be formed in the resist, then the replica template must be patterned with an inverse array of pillars. In such a scenario, a master template can be fabricated by e.g. exposing a positive electron beam resist (in which resist is removed in the exposed area of the electron beam) that has been applied onto a master template substrate so as to form the desired hole array in the electron beam resist. This array is then pattern transferred into the master template substrate material itself, thereby forming the master template having the desired array of holes. In the next step, an opposite tone pattern is created in a replica template. That is, the master template is used to create a pattern in an imprint resist positioned on a replica template substrate such that the formed pattern comprises of an array of resist pillars formed by the master template array of holes. The resist pillars are then pattern transferred into the replica template substrate itself, thereby forming a replica template having an array of pillars. The replica template with its array of pillars can then be used as a working template to pattern arrays of holes in resist deposited on e.g. a semiconductor wafer.

There are cases, however, where such a replication process is not amenable to imprinting the desired pattern tone of resist on the semiconductor wafer. For example, in the above example the formed replica template can imprint holes but it does not provide for the direct imprinting of pillars on the semiconductor wafer. A hole tone replica template for direct imprinting of pillars can require the initial fabrication of a pillar tone master template. Such a pillar tone master template can be fabricated with, e.g., a negative acting e-beam resist, which leaves resist behind in the areas where the electron beam impinges on the resist. In such a case an array of pillars could be formed in the electron beam resist in order to create a master template with a pillar tone which could then be used to create a hole tone replica template. However, the choices of negative e-beam resists are not ideal for the fabrication of nanoscale features. Negative acting chemically amplified resists tend to have the correct electron beam sensitivity to allow reasonable write times of the master template, but are limited in resolution. Pillars and dense arrays of lines on the order of 25 nm or less cannot be resolved. High resolution negative tone resists which are not chemically amplified, such as SU8 and calixerene, have the desired resolution, but the exposure doses are so high that the writing times for a single master template would be measured in days or weeks. These types of writing times for master template fabrication are prohibitive from a commercial production and cost standpoint.

An additional approach is simply to add an additional replication step to the template fabrication sequence. In this case a master template is replicated, thereby creating a first replica template, as previously described. This first generation replica template is then itself used to create a second generation replica template for direct use in production, e.g., patterning a semiconductor wafer. In such a replication process, the first generation replica template can be used in the same way as described above with respect to a master template for a single replication sequence, meaning that the first generation replica template may be used many times (e.g. hundreds or even thousands of times) in making second generation replica templates. When the master template has, for example, a hole tone pattern, the resultant second generation replica template will likewise have a hole tone pattern that can then be used to imprint pillars on a semiconductor wafer. Such processes are not limited to imprinting pillars; imprinting other raised structure features, such as lines, squares and rectangles are also possible. In general, the process described can be used to create second generation replica templates to imprint any raised pattern feature, as long as the opposite tone can be first formed in the original master template.

Figure 2A:
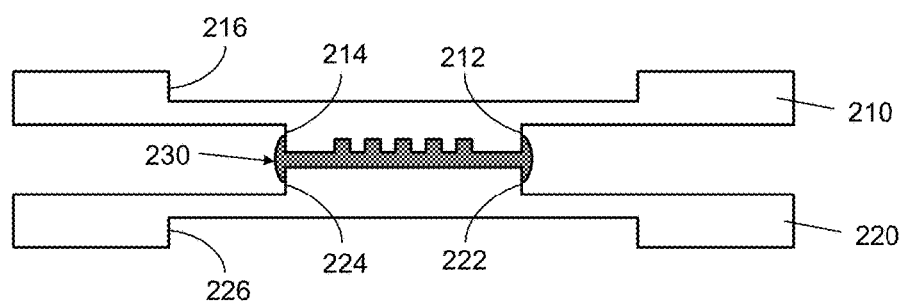
FIGS. 2A-2B illustrate simplified views of the formation of a second replica template from a first replica template.
Figure 2B:
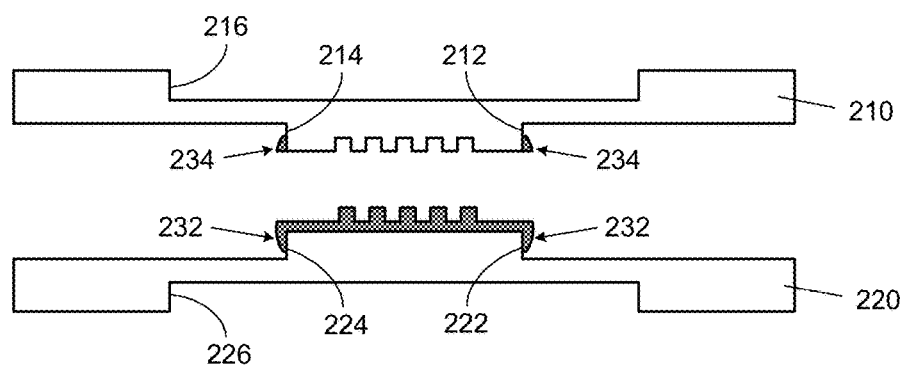

However, when a first generation replica template is used to generate a second generation replica template, certain difficulties can arise. For example, in FIG. 2A it can be seen that both first generation replica template 210 and second generation replica template blank 220 include mesas 212 and 222, respectively. Such mesas are deployed for various reasons. Mesa 212 on first generation template 210 is provided so that during the fabrication process of the first generation template itself, the surfaces of the master template and the first generation template blank do not contact each other outside of the patterned area. Such contact could otherwise potentially create defects. Likewise, mesa 222 on second generation template blank 220 is needed to define the patterning area when the resultant template is then used to e.g. imprint a semiconductor wafer as well as to avoid contacting the template with the wafer outside of the desired patterning area. Such contact can lead to damage and/or defects to the template and/or the wafer.

Where mesa 212 of first generation template 210 is the same size as mesa 222 of second generation replica 220, as is depicted in FIG. 2A, there is the possibility that resist extruded during the imprint replication process can lead to downstream defects in further replication processes. As depicted in FIG. 2A extruded resist 230 extends beyond the borders of each mesa 212 and 222 and attaches itself to sidewalls 214, 224 of mesas 212, 222. Upon separation, as depicted in FIG. 2B, portions 232 and 234 of extruded resist 230 can remain attached to sidewalls 214 and 224, respectively. In particular, extruded resist portion 234 remaining on sidewall 214 of first generation replica template 210 is a potential source of defects in further template replication processes. For example, extruded resist portion 234 can become detached during the replication of a subsequent second generation replica, thereby creating unwanted defects in e.g. the patterning area of such replicated template, or elsewhere. Such extruded resist can be removed from the replica template using well known wet clean processes. However, such processes can, over time, cause a shift in the size of the relief images forming the critical features on the template. That is, such cleaning processes can alter the critical dimensions of the replica template features over time, thereby rendering the replica unusable for continued replication of second generation replica templates.

Figure 3:
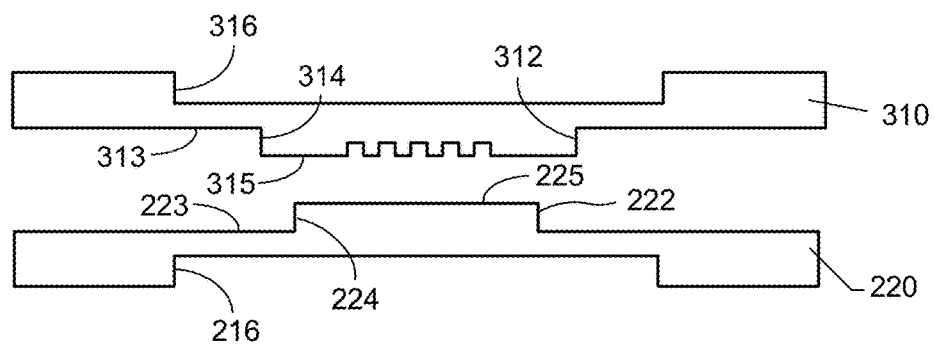
FIG. 3 illustrates a simplified side view of a first replica template and second replica substrate according to an embodiment.
Figure 4:
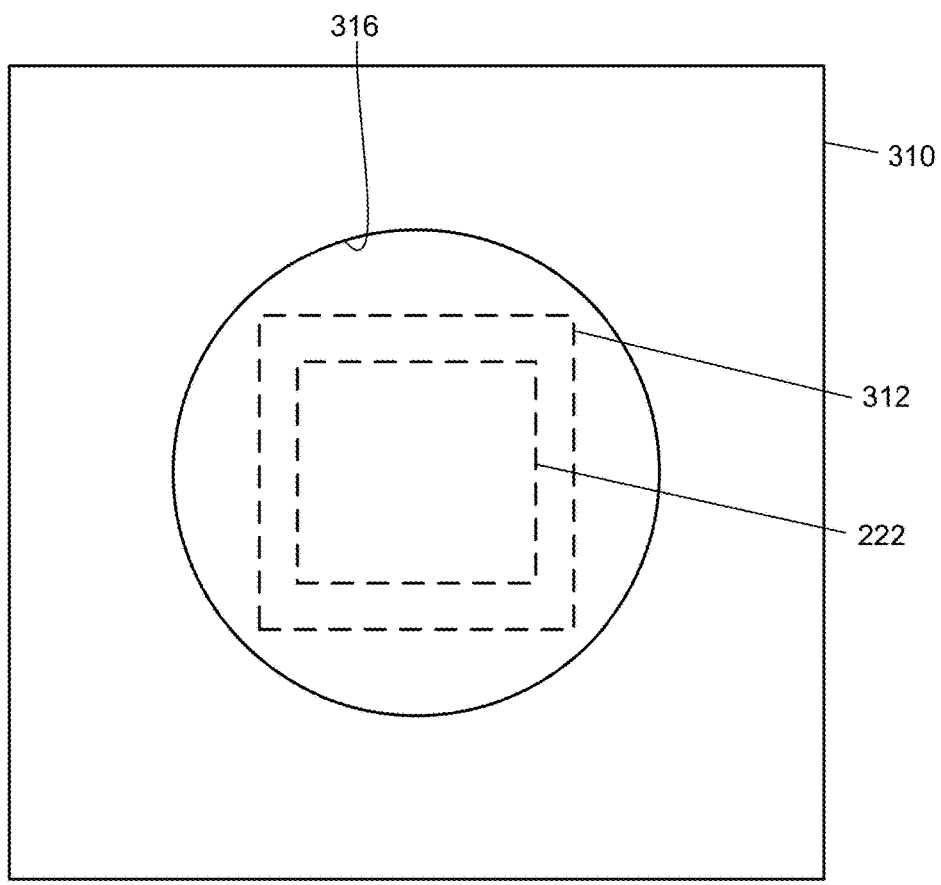
FIG. 4 illustrates a top view of the replica template and substrate of FIG. 3.
Figure 5A:
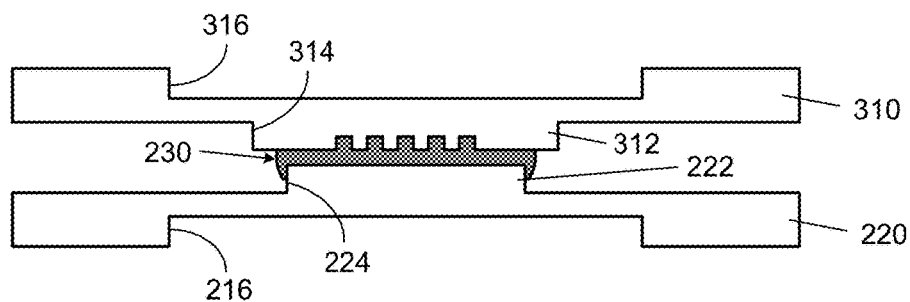
FIG. 5A-5B illustrate simplified views of the formation of a second replica template from a first replica template according to an embodiment.
Figure 5B:
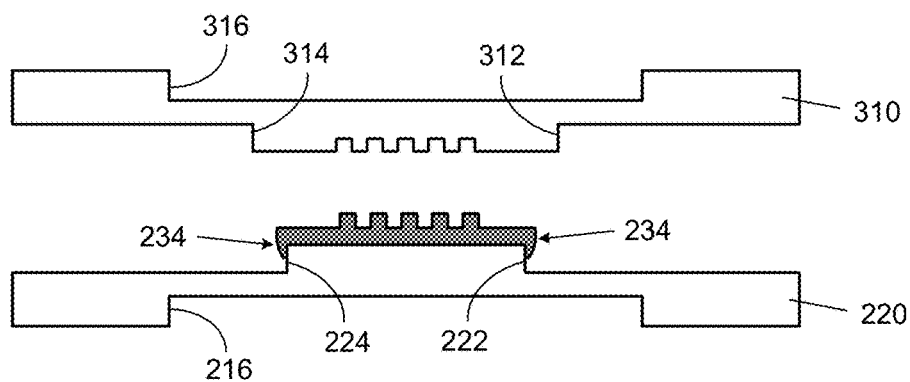

Provided herein are template replica designs and processes that can overcome such limitations. Turning now to the embodiment depicted in FIGS. 3 and 4, first generation template 310 includes mesa 312 extending from surface 313 of template 310. Mesa 312 further includes patterning surface 315 having a relief image formed thereon. Second generation replica substrate 220 likewise includes mesa 222 extending from surface 223 of substrate 220, with mesa 222 further defining active region 225. Mesa 312 of first generation template 310 is further configured such that it has a larger surface area as compared to that of mesa 222 of second generation template replica substrate 220. As a result of such mesa oversizing, after imprinting and curing of the formable material and then separating, as shown in FIGS. 5A-5B, extruded resist 234 preferentially adheres to sidewall 224 of mesa 222 of second generation replica template substrate 220, leaving sidewall 314 of first generation template 310 free of any residual extruded resist, thereby avoiding defects in subsequent replications using first generation template 310 and also avoiding unnecessary repeated cleaning steps that could, over time, detrimentally alter the size of the relief features on first generation template 310. By contrast, extruded resist 234 adhered to sidewall 224 of second generation replica substrate 220 is not problematic. This is because after the pattern transfer is finished on second generation replica substrate 220 to form the second generation replica substrate, extruded resist 234 can be removed with a one-time wet etch process, such as sulfuric acid and hydrogen peroxide etch, or a one-time dry etch process, such oxygen plasma, VUV treatment and the like.

The minimum oversizing of first generation replica template mesa 312 relative to second generation replica substrate 222 is a function of the expected distance of extruded resist during an imprint process. For example, mesa 312 can be configured such that, when template 310 is positioned relative to substrate 320 during the imprinting process, the minimum distance between any point on the perimeter of mesa 312 and the nearest point on the perimeter of mesa 222 is such that any polymerizable material that is extruded from between template patterning surface 315 and substrate active region 225 preferentially adheres to the substrate sidewall 224 and does not adhere to template sidewall 314. For thicker imprints, e.g. 100 nm and above, this distance might be as large as 6 microns. For thinner imprints, e.g. less than nm, this distance can be as small as 1 micron. The maximum oversizing of the first generation template mesa will be primarily limited by the maximum exposure field size of the imprint replication tool used, but an oversizing on the order of a millimeter or even 10's of millimeters is feasible. In some examples, then, the first generation template mesa oversizing can be set to at least one micron larger than the second generation template mesa in both the x and y directions. The range of oversizing can be between 1 micron and 50 mm in both x and y, with a more typical oversizing of 2 microns to 1 mm in both x and y.

Figure 6:
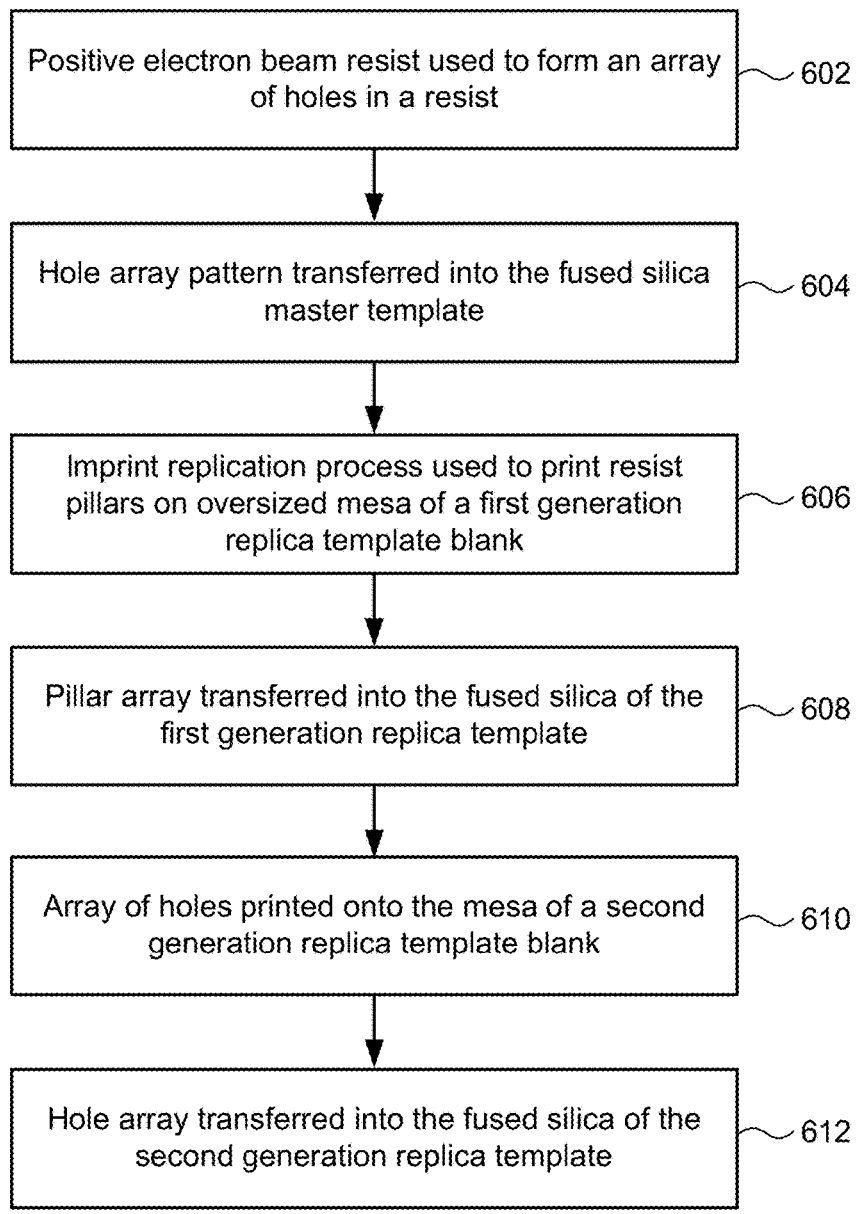
FIG. 6 illustrates a flow chart of an exemplary method for forming a second replica template from a first replica template.

FIG. 6 illustrates an exemplary method of template replication that incorporates such mesa oversizing in order to fabricate a second generation template having a hole array that can be then used to imprint corresponding pillars on e.g. a semiconductor wafer. In step 602, the process starts with a fused silica master template blank that is exposed with a positive electron beam resist to form of an array holes in the electron beam resist. In step 604, the hole pattern in the resist is then transferred into the fused silica master template, thereby forming a master template having an array of holes in the glass. The next step, 606, begins the template replication process, in which the opposite tone pattern is created in a first generation replication template. That is, in step 606 the master template is used to imprint an array of pillars in resist positioned on a first generation replica blank likewise formed of fused silica and having the desired mesa oversizing as described above. In step 608, the resist pillars are then pattern transferred into the fused silica, thereby creating the first generation replica template having an array of pillars. In step 610, this first generation template is then used imprint an array of holes in resist positioned on a second generation replica blank, again likewise formed of fused silica. As a final step 612, the array of holes are pattern transferred into the fused silica to form the second generation replica template having the same pattern tone, i.e., holes, as the master template. This second generation replica can then be used to imprint an array of pillars on e.g. a semiconductor wafer.

In certain embodiments, both first and second generation templates can be formed from 6 inch by 6 inch by 0.25 inch blank fused silica plates, with 64 mm diameter center backside regions that are cored out to a thickness of 1.1 mm. The maximum patterned area can be on the order of 26 mm×33 mm (in the x and y directions, respectively), which is the standard field size in the semiconductor industry.

In some embodiments, the template thicknesses and cored out diameters can be the same for both the first and second generation templates. This is not a necessary condition, however. Further, while in some embodiments, the cored-out area has a 1.1 mm thickness, the actual thicknesses of the template active pattern areas can be as little as 0.100 mm and as large as 6.35 mm. If the backside of the template is cored to be less than 6.35 mm, the diameter of the cored area can have a minimum value that exceeds the maximum diagonal length of the patterned area on the template.

Further, template mesa sizes need not be limited to a 26 mm×33 mm field size. For example, replica templates formed as proved herein can be used to imprint multiple fields. As an example, two fields printed with a single imprint, when placed side by side on a template, would have the dimensions of either 52 mm×33 mm or 66 mm×26 mm. Similarly, a two by two array of 26 mm×33 mm fields, would have the dimensions 52 mm×66 mm. Many other combinations are possible, based on both the actual size of a single field on the number of fields printed in a single imprint step.

Templates and template blanks may be formed from e.g., fused silica, as previously described, and may also be formed from such materials including, but not limited to, quartz, silicon, organic polymers, siloxane polymers, borosilicate glass, fluorocarbon polymers, metal, hardened sapphire, and/or the like.

Templates and template blanks can have a 6 in×6 in plate configuration as well as other configurations. Silicon substrates, for example, are often round, and have diameters ranging from 50 mm up to 450 mm. Templates can also be plate shaped, with varying x and y dimensions as well as varying thicknesses.

Additionally, although the above processes, systems and templates are described in the context of avoiding extrusion defects between first and second generation replica templates, it will be appreciated that such methods, systems and templates are not so limited. For example the master template itself can be fabricated to have a mesa that is oversized relative to a first replica substrate. Likewise, the approach can also be applied in fabricating generations of replica templates beyond the second generation.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method comprising the steps of:
    (a) providing a substrate having a substrate mesa extending from a surface of the substrate, the substrate mesa defining an active region having a first area;
    (b) providing a template having a template mesa extending from a surface of the template, the template mesa defining a patterning region having a second area , the second area larger than the first surface area of the substrate, the template mesa further having a patterning surface with a relief image formed thereon;
    (c) positioning the template in superimposition with the substrate such that patterning region of the template mesa overlaps the active region of the substrate mesa;
    (d) filling a volume defined between the patterning region of the template and the active region of the substrate with a polymerizable material;
    (e) solidifying the polymerizable material to form a patterned layer on the substrate; and
    (f) separating the template from the solidified patterned layer.

2. The method of claim 1 wherein the first and second areas define first and second perimeters, respectively, and are further configured such that, during the positioning, filling and solidifying steps, a minimum distance between any point on the first perimeter and a nearest point on the second perimeter is such that any polymerizable material that is extruded from between template patterning region and the substrate active region adheres to a sidewall of the substrate mesa and does not adhere to a sidewall of the template mesa.

3. The method of claim 2 wherein the minimum distance is from 1 micron to 50 mm.

4. The method of claim 2 wherein the minimum distance is from 2 microns to 1 mm.

5. The method of claim 1 wherein the template and the substrate have cored-out backside areas.

6. The method of claim 1 wherein the template and the substrate have the same thickness dimensions.

7. The method of claim 1 wherein the template and the substrate are of the same material.

8. The method of claim 1 further comprising the steps of transferring the formed pattern into the substrate to form a replica template.

9. The method of claim 8 wherein the formed replica template is a second generation replica template having the same relief pattern as a master template.

10. The method of claim 9 wherein the relief pattern is an array of holes.

11. A method comprising the steps of:
   (a) providing a substrate having a substrate mesa extending from a surface of the substrate, the substrate mesa defining an active region having a first area;
   (b) providing a template having a template mesa extending from a surface of the template, the template mesa defining a patterning region having a second area, the second area larger than the first surface area of the substrate, the template mesa further having a patterning surface with a relief image formed thereon;
   (c) positioning the template in superimposition with the substrate such that patterning region of the template mesa overlaps the active region of the substrate mesa;
   (d) filling a volume defined between the patterning region of the template and the active region of the substrate with a polymerizable material;
   (e) solidifying the polymerizable material to form a patterned layer on the substrate;
   (f) separating the template from the solidified patterned layer;
   (g) transferring the formed pattern into the substrate to form a replica template;
   (h) filling a volume defined between the replica template and a second substrate with a polymerizable material; and
   (i) solidifying the polymerizable material to form a patterned layer on the second substrate.

12. A method of manufacturing an article comprising:
   forming a pattern on a second substrate according to the method of claim 11;
   transferring the formed pattern into the second substrate; and
   processing the second substrate to manufacture the article.

13. The method of claim 12 wherein the article is a semiconductor device.

* * * * *